(12) United States Patent
Alcoe

(10) Patent No.: US 6,816,385 B1
(45) Date of Patent: Nov. 9, 2004

(54) COMPLIANT LAMINATE CONNECTOR

(75) Inventor: David J. Alcoe, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/714,373

(22) Filed: Nov. 16, 2000

(51) Int. Cl.[7] .............................. H05K 7/00; H05K 7/02; H05K 1/11
(52) U.S. Cl. ....................... 361/767; 361/748; 361/760; 361/777; 174/255; 174/263
(58) Field of Search ................. 174/250–268; 361/728–729, 735, 743, 748–749, 760, 767, 768, 777, 779, 784–785, 790; 257/778, 712, 713, 737, 338, 780, 620, 701, 706, 707, 720, 795, 796, 738; 228/179.1, 180.1, 180.21, 180.22

(56) References Cited

U.S. PATENT DOCUMENTS

| | | |
|---|---|---|
| 5,219,794 A | 6/1993 | Satoh et al. |
| 5,311,402 A | 5/1994 | Kobayashi et al. |
| 5,477,933 A | 12/1995 | Nguyen |
| 5,634,268 A | 6/1997 | Dalal et al. |
| 5,759,737 A | 6/1998 | Feilchenfeld et al. |
| 5,834,848 A * | 11/1998 | Iwasaki ...................... 257/778 |
| 5,894,410 A | 4/1999 | Barrow |
| 5,900,675 A * | 5/1999 | Appelt ....................... 257/778 |
| 6,014,317 A * | 1/2000 | Sylvester .................... 361/760 |
| 6,050,832 A * | 4/2000 | Lee ............................ 439/91 |
| 6,104,093 A * | 8/2000 | Caletka ...................... 257/778 |
| 6,177,728 B1 * | 1/2001 | Susko ......................... 257/737 |
| 6,191,952 B1 * | 2/2001 | Jimarez ....................... 361/771 |
| 6,284,569 B1 * | 9/2001 | Sheppard ..................... 438/110 |
| 6,309,915 B1 * | 10/2001 | Distefano .................... 438/127 |
| 6,317,331 B1 * | 11/2001 | Kamath et al. ............. 361/760 |
| 6,333,563 B1 * | 12/2001 | Jackson et al. ............. 257/778 |

FOREIGN PATENT DOCUMENTS

| | | |
|---|---|---|
| JP | 02-252250 | 10/1990 |
| JP | 06-291165 | 10/1994 |
| JP | 08-273726 | 10/1996 |
| JP | 10-079281 | 3/1998 |
| JP | 2000-216302 | 8/2000 |
| JP | 2002-141121 | 5/2002 |
| WO | WO 00/11755 | 3/2000 |

OTHER PUBLICATIONS

Peterson et al., IBM Technical Disclosure Bulletin, "Thermally Enhanced Three–Dimensional Flex Interconnect of Multi–Chip Modules," vol. 36, No. 12, Dec. 1993, p. 39.
Nakamura et al., 2000 International Symposium on Microelect., "Multilayer Substrate with Low Coefficent of Thermal Expansion," pp. 235–240.

* cited by examiner

Primary Examiner—David Martin
Assistant Examiner—Michael L. Lindinger
(74) Attorney, Agent, or Firm—Schmeiser, Olsen & Watts; William H. Steinberg

(57) ABSTRACT

The present invention provides a flexible shear-compliant laminate connector having a plurality of contacts formed on a first surface and second surface of the connector, wherein select contacts on the first surface of the connector are off-set from select contacts on the second surface of the connector.

43 Claims, 4 Drawing Sheets

COMPLIANT LAMINATE CONNECTOR

BACKGROUND OF THE INVENTION

1. Technical Field

The present invention relates generally to semiconductor manufacture, and more particularly, to the connection of an electronic device to external circuitry.

2. Related Art

As illustrated in FIG. 1, which depicts a related art module a printed circuit card 12 is conventionally connected to a substrate 14, such as a chip package, using a plurality of solder ball connections 16. However, because the card 12 and the substrate 14 expand at different rates when exposed to a thermal stimulus, due to the difference in the coefficient of thermal expansion (CTE) of each, stresses are created within the solder ball connections 16 which often lead to solder ball fatigue, and subsequently result in failure of the module 10. This is particularly problematic in ceramic, glass/ceramic and aluminum/ceramic modules. Also, due to the flexibility of organic substrate modules, thermal-driven warpage may further exacerbate the problem. Accordingly, there exists a need in the industry to solve these and other problems.

SUMMARY OF THE INVENTION

A first general aspect of the present invention provides an electronic device, comprising: a first substrate; a second substrate; and a flexible connector attached between the first and second substrates by a plurality of contacts on a first and a second surface of the connector.

A second general aspect of the present invention provides a connector system, comprising: a flexible substrate; a plurality of contacts formed on a first surface of the substrate; and a plurality of contacts formed on a second surface of the substrate, wherein select contacts on the first surface of the substrate are off-set from select contacts on the second surface of the substrate.

A third general aspect of the present invention provides a method of forming an electronic device, comprising: providing a flexible connector having a plurality of contacts on a first surface and a plurality of contacts on a second surface; and attaching the flexible connector between a first substrate and a second substrate via the contacts.

A fourth general aspect of the present invention provides a method of forming an electronic device, comprising: providing a first substrate; providing a second substrate; providing a flexible connector having a plurality of contacts on a first surface of the connector and a plurality of contacts on a second surface of the connector, wherein select contacts on the first and second surface of the connector are off-set; and attaching the contacts on the first surface of the connector to the first substrate and the contacts on the second surface of the connector to the second substrate.

The foregoing and other features of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will, be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
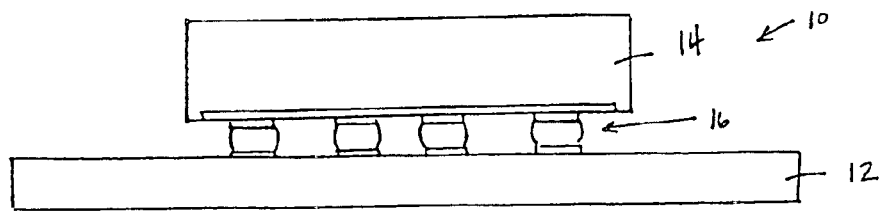
FIG. 1 depicts a cross-sectional view of a related art module.
Figure 2:
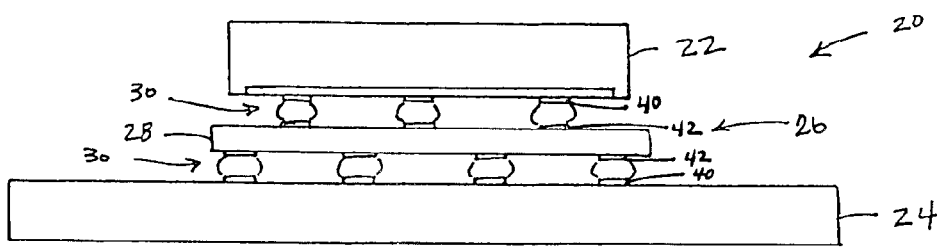
FIG. 2 depicts a cross-sectional view of a module in accordance with the present invention.

Referring to the drawings, FIG. 2 shows a cross-sectional view of a module 20 in accordance with the present invention. The module 20 includes a substrate 22, such as a chip package, or other component, and a printed circuit card 24. The chip package 22 and the printed circuit card 24 are connected by a flexible shear-compliant connector or interconnection 26. The interconnection 26 includes a substrate or laminate 28 and a all plurality of contacts, or in this example, ball grid array (BGA) connections 30, on the top and bottom surface of the laminate 28. The BGA connections 30 are wetted between a top bonding pad 40 of both the chip package 22 and the card 24, and a bottom bonding pad 42 of the laminate 28, using techniques known in the art. The top and bottom bonding pads 40, 42 comprise copper, or other similarly used material. The contacts 30 may alternatively comprise solder columns, etc.

The chip package 22 comprising glass/ceramic has a CTE of approximately 3 ppm/° C., aluminum/ceramic has a CTE of approximately 5–6 ppm/° C., a HyperBGA™ (International Business Machines Corp.) laminate has a CTE of approximately 10–12 ppm/° C., epoxy glass has a CTE of approximately 17–18 ppm/° C., and the CTE of other packages, such as chip-scale or wafer-scale packages, can vary greatly. The card 24 has a CTE of approximately 16–22 ppm/° C. However, due to the flexible nature of the laminate 28 of the interconnection 26, the effects of the CTE mismatch between the various kinds of chip packages 22 and the printed circuit card 24 are minimized. As a result, the occurrence of solder ball fatigue is likewise minimized.

Figure 3A:
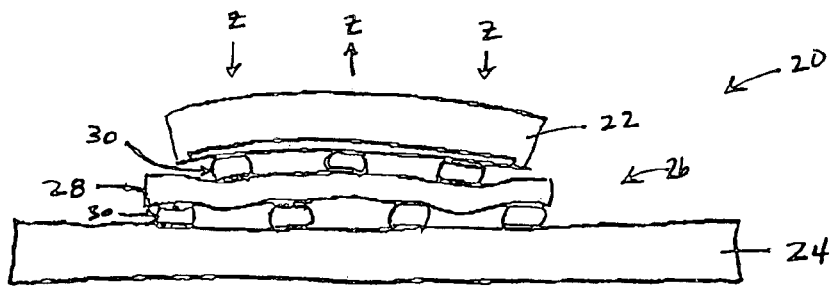
FIG. 3A depicts the module of FIG. 2 experiencing stresses in the Z direction.
Figure 3B:
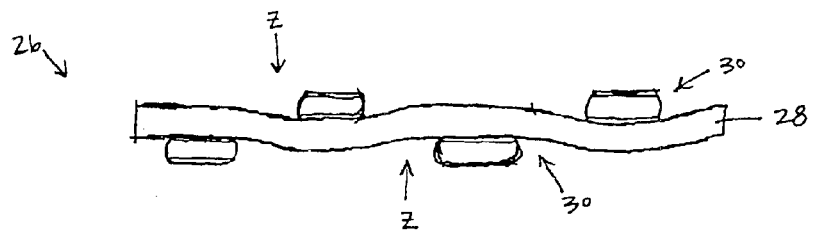
FIG. 3B depicts the flexible shear-compliant interconnection during bending.

In particular, a large portion of the thermally created shear stress is spread throughout the length of the laminate 28, rather than being concentrated within the individual BGA connections 30. The flexible nature of the laminate 28 is further enhanced by selectively placing critical BGA connections 30 in staggered or off-set or alternating positions on the top and bottom surfaces of the laminate 28. Note that not all BGA connections 30 need to be staggered to obtain an optimal solder ball fatigue life. For ceramic components, the critical BGA connections 30 are located at the far corners, or the far DNP (distance to neutral point), and may be staggered at that location. Alternatively, for organic components, the critical BGA connections 30 are located under the die region of the laminate 28, and may be staggered at that location. The BGA connections 30 are off-set by approximately the thickness of the laminate 28. This provides the laminate 28 with additional flexibility in the Z direction, as illustrated in FIGS. 3A and 3B. In particular, FIG. 3A shows the module 20 during bending, wherein the chip package 22 and the card 24 deform in the Z direction, thereby applying stresses to the interconnection 26, as illustrated. However, due to the flexible nature of the laminate 28, the interconnection 26 can rotate, flex, or bend upwards and downwards as needed, in response to stresses in the X, Y and Z directions created by the CTE mismatch between the chip package 22 and the circuit card 24, without transmitting the stresses into the critical BGA connections 30, as further illustrated in FIG. 3B.

Additionally, because the laminate 28 absorbs most of the shear stresses within the module 20, the total "stand-off," or the distance between the top BGA connection 30 and the bottom BGA connection 30, does not need to be as high as conventionally required to reduce the stresses and solder ball fatigue. For instance, the total stand-off may be in the range of approximately 14–60 mil. A lower stand-off produces a module 20 wherein the chip package 22 and the printed circuit card 24 are closer together, which provides improved electrical performance, lower inductance, etc.

Figure 4:
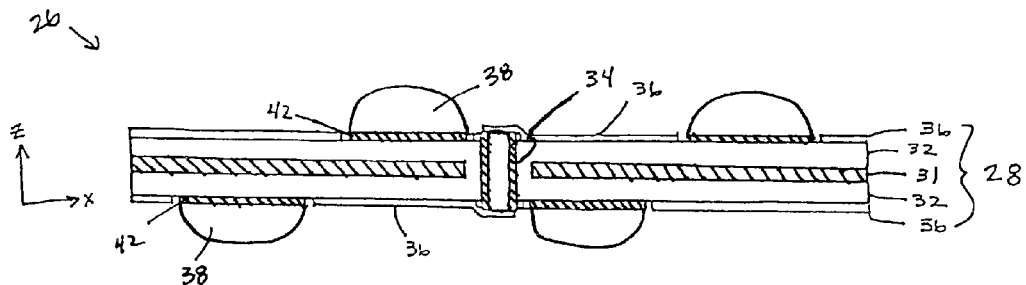
FIG. 4 depicts an enlarged cross-sectional view of a flexible shear-compliant interconnection in accordance with a first embodiment of the present invention.

As illustrated in FIG. 4, and in accordance with a first embodiment, the laminate 28 includes a core 31 comprising copper-invar-copper (CIC), or other similarly used material, such as copper, stainless steel, nickel, iron, molybdenum, etc. The core 31 has a thickness in the range of approximately 1–3 mil., e.g., 2 mil. The choice of core 31 material will depend upon the material within the chip package 22 being attached thereto. For a ceramic chip package 22, having a relatively low CTE, (approximately 5–6 ppm/° C.), the overall CTE of the laminate 28 may be about midway between the card 24 and the chip package 22. Therefore, in this example the overall CTE of the lamiante 28 may be approximately 10–12 ppm/° C. This provides improved distribution of stress, and therefore a reduction of stresses within the BGA connections 30 and the interconnection 26. Accordingly, the core 31 may be a material having a low CTE, such as copper-invar-copper. If the chip package 22 has an in-plane CTE that nearly matches the card 24, then the laminate 28 may comprise a material having a similar CTE to provide additional flexibility to absorb shear and warpage stresses of either the chip package 22, the card 24, or both. In the event the card 24 has a CTE of approximately 17 ppm/° C., the core 31 may comprise copper, having a similar CTE.

The core 31 is surrounded by a flexible dielectric layer 32. The dielectric layer 32 is a shear compliant material which is also capable of bending or flexing in the Z direction, such as polyimide, PTFE (polytetrafloroethylene), an epoxy dielectric material, e.g., FR4, etc. The dielectric layer 32 on each side of the core 31 has a thickness in the range of approximately 1–5 mil., e.g., 3 mil. A plated through hole (PTH) 34 is formed through the dielectric layer 32 using conventional techniques. A solder mask 36 may then be deposited over the dielectric layer 32 using a process known in the art. The solder mask 36 has a thickness in the range of approximately 1–3 mil., e.g., 2 mil. The solder mask 36 may cover the PTH 34 to prevent solder wicking. Alternatively, the solder mask 36 may also fill the PTH 34 during deposition, which acts as a reinforcing material therein. A plurality of solder balls 38 are then wetted to the bottom bonding pad 42 on the surface of the dielectric layer 32, using a process known in the art.

Figure 5:
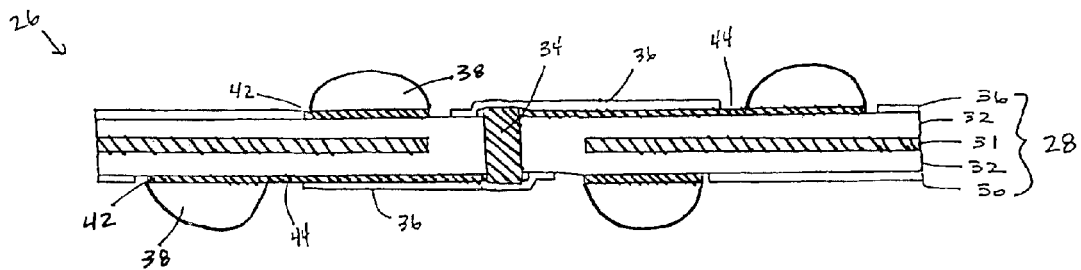
FIG. 5 depicts an enlarged cross-sectional view of the flexible shear-compliant interconnection in accordance with a second embodiment of the present invention.

FIG. 5 illustrates an alternative configuration for the interconnection 26 in accordance with a second embodiment. In particular, the BGA connections 30 are moved away from the PTH 34, which further reduces the stresses on the PTH 34, and a connection 44 is formed over the dielectric layer 32. In this example, the connection 44 is formed between the BGA connection 30 on the top right side of the interconnection 26 and the PTH 34, and between the BGA connection 30 on the bottom left side of the interconnection 26 and the PTH 34. The connection 44 comprises a plated copper material, which has been formed and plated using a process known in the art. This provides for routing of the electrical connection from the BGA connection 30 on the top right side of the interconnection 26 to the BGA connection 30 on the bottom left side of the interconnection 26 through copper circuitry (illustrated by the cross hatching). This feature is particularly helpful when producing a "fan-out", wiring scheme, wherein the BGA connections 30 of the printed circuit card 24 have a greater pitch, or closer spacing, than the BGA connections 30 of the chip package 22. The solder mask 36 may then be formed over the top of the connection 44 as mentioned above.

Figure 6:
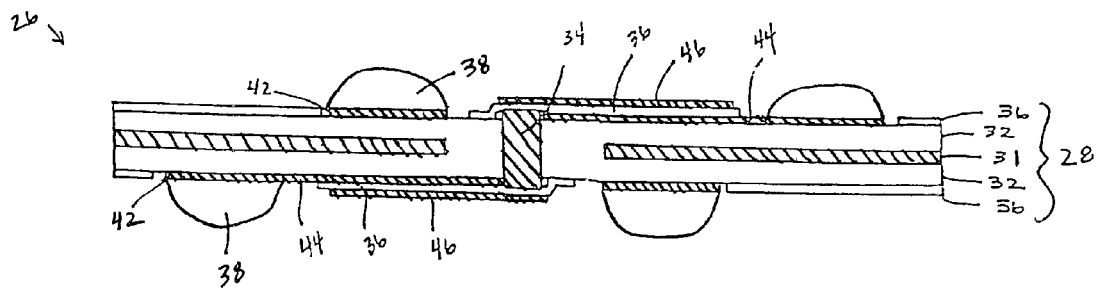
FIG. 6 depicts an enlarged cross-sectional view of the flexible shear-compliant interconnection in accordance with a third embodiment of the present invention.

FIG. 6 illustrates an alternative configuration for the interconnection 26 in accordance with a third embodiment. In particular, a ground shield 46 is formed over the top surface of each layer of solder mask 36. This provides improved impedance control for the module 26, which is particularly beneficial for use with high performance applications, such as high speed network switches and servers.

Figure 7:
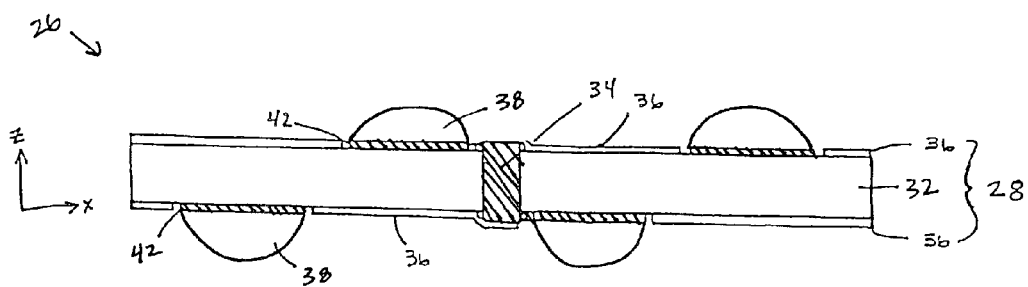
FIG. 7 depicts an enlarged cross-sectional view of the flexible shear-compliant interconnection in accordance with a fourth embodiment of the present invention.

FIG. 7 illustrates an alternative configuration for the interconnection 26 in accordance with a fourth embodiment. In particular, the interconnections 26 illustrated in FIGS. 4-6 may be formed without the core 31. As shown in FIG. 7, the laminate 28 comprises a single layer of dielectric material 32, such as polyimide, or other similar material, having copper circuitry (as illustrated by the cross hatching) on either side. The circuitry is covered by the solder mask 36, which has openings for the BGA connections 30. The circuitry on one side of the laminate.28 would form a ground plane, and the other side would form a fan-out configuration. The circuitry on each side of the laminate 28 would be connected through the PTH 34.

Figure 8:
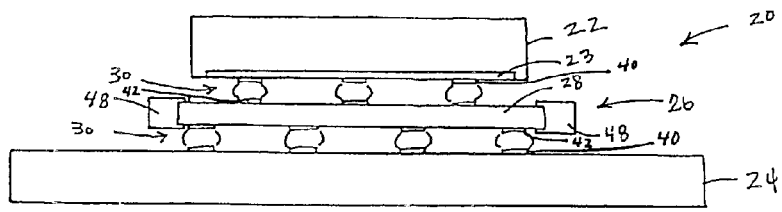
FIG. 8 depicts an enlarged cross-sectional view of the module in accordance with a fifth embodiment of the present invention.
Figure 9:
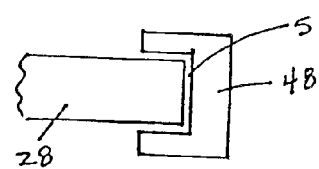
FIG. 9 depicts an enlarged view of a channel between the stiffener frame and the laminate in accordance with the fifth embodiment of the present invention.

In accordance with a fifth embodiment, FIG. 8 shows a stiffener frame 48 which surrounds the laminate 28 of the flexible shear-compliant interconnection 26. The stiffener frame 48 comprises a high temperature plastic material, having a minimal channel 52 depth (refer to FIG. 9). In other words, only a small portion of the stiffener frame 48 overlaps the flexible laminate 28 to allow for easier assembly, and subsequent removal of the frame 48 from the laminate 28 after the module 20 is assembled. The stiffener frame 48 provides for easier handling of the interconnection 26 and assists in maintaining a relatively planar laminate 28 during manufacture.

For example, with the aid of the stiffener frame 48, the module 20 may be assembled by first placing the laminate 28 over a plurality of solder balls 38, utilizing a conventional reflow process. After the BGA connections 30 are formed on a first side of the laminate 28, the process is repeated to form the BGA connections 30 on the other side of the laminate 28 thereby forming the flexible shear-compliant interconnection 26 (as illustrated in FIGS. 4-7). The interconnection 26 may then be placed on the printed circuit card 24, such that the BGA connections 30 are aligned with the top bonding pads 40 of the printed circuit card 24. The chip package 22 is then placed on top of the flexible shear-compliant interconnection 26, such that the BGA connections 30 are aligned with the top bonding pads 40 of a connecting area 23 of the chip package 22. The connecting area 23, which allows the BGA connections 30 to wet to the chip, package 22, comprises copper, nickel/gold plated copper, or other similarly used materials. Thereafter, a single conventional reflow process is needed to form the interconnections 26, using a process known in the art. The stiffener frame 48 may then be removed to produce the finished module 20.

The interconnection 26 and the stiffener frame 48 allow for the preassembly of all the BGA connections 30 on the laminate 28 without having to individually place each solder ball 38 onto the chip package 22 or card 24, which would otherwise be required. This allows, for example, for the use of a socket or land grid array for test and burn-in before assembly with BGA connections 30. Furthermore, the interconnection 28 and the stiffener frame 48 assist in the formation of the BGA connections 30 on the laminate 28 in a pre-aligned orientation prior to connection of the chip package 22 and/or printed circuit card 24, which reduces manufacturing time. Additionally, the interconnection 28 and the stiffener frame 48 enable the formation of the module 20 with only one reflow process, rather than multiple reflow processes for each BGA connection 30, which further reduces thermally generated stresses and damage within the BGA connections 30 and the chip package 22.

As will be understood by those skilled in the art, the module 20 may be assembled in various other ways. For instance, the laminate 28, having BGA connections 30 attached thereto, could be attached to the chip package 22 using a high melting point solder, such as a solder material having a melting point above 280° C., e.g., a conventional tin/lead solder having a low amount of tin, etc. Thereafter, the laminate 28, having BGA connections 30 attached thereto, could be attached to the printed circuit card 24 using a low melting point solder, such as a solder material having a melting point below 250° C., e.g., a conventional tin/lead eutectic solder material, a lead free solder material, etc. Alternatively, the BGA connections 30 may be formed on the chip package 22 and the card 24, and the laminate 28 may be attached therebetween, and so on.

Figure 10:
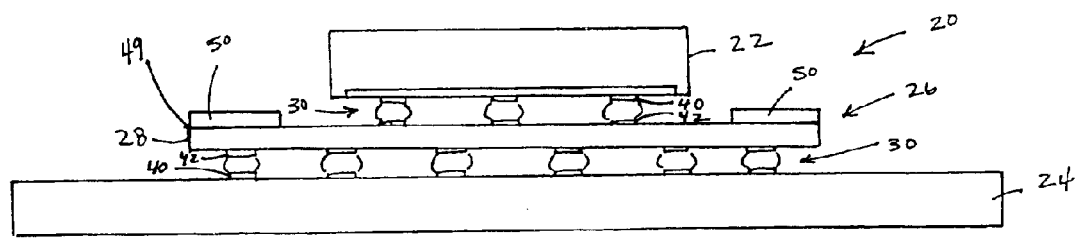
FIG. 10 depicts an enlarged cross-sectional view of the module in accordance with a sixth embodiment of the present invention.

FIG. 10 illustrates a sixth embodiment of the present invention. In particular, a stiffener 50, which assists in maintaining a planar laminate 28, may be adhesively attached to the surface of the laminate 28, using an acrylic adhesive material 49, such as Pyralux™ (DuPont), an epoxy, such as Sylgard™ (Dow-Corning), a thermal adhesive, such as a silicon made by Dow-Corning, or General Electric, etc. In this manner, the module 20 will have a gradual variation of in-plane CTE from the chip package 22 to the interconnection 26 and finally to the card 24. Accordingly, the potential for thermal warpage, which results from components having varied in-plane CTE values, will be reduced. The thermal conductivity of the laminate 28 combined with the stiffener 50 can provide additional heat spreading and thermal dissipation of heat from the chip package 22 to ambient air, acting as a heat sink. This is particularly useful when constructing a module 20 having a fan-out wiring scheme. As illustrated, in a fan-out wiring scheme the area of the BGA connections 30 is greater on the bottom side of the flexible shear-compliant interconnection 26 than on the top side of the interconnection 26.

The stiffener 50 comprises a material having the same or a similar CTE as that of the laminate 28, e.g., between approximately 10–20 ppm/° C., to minimize thermally generated stresses and warpage therebetween. For instance, a stiffener 50 comprising stainless steel, (which has a CTE of approximately 10 ppm/° C.), may be used with a laminate having a CIC core 31, (which likewise has a CTE of approximately 10 ppm/° C.). Alternatively, a stiffener 50 comprising copper, (which has a CTE of approximately 17 ppm/° C.), may be used with a laminate having a copper core 31, (which likewise has a CTE of approximately 17 ppm/° C.). Using a metal stiffener 50 also provides for an enhanced thermal dissipation, acting as a heat spreading heat sink, thereby further reducing thermally generated stresses and failures within the BGA connections 30.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope the invention as defined in the following claims.

What is claimed is:

1. An electronic device, comprising:
   a first substrate having a first coefficient of thermal expansion;
   a second substrate having a second coefficient of thermal expansion; and
   a flexible connector attached between the first and second substrates by plurality of contacts on a first and second surface of the connector, wherein all of the contacts on the first and second surfaces alternate with respect to each other, and wherein the coefficient of thermal expansion of the connector is approximately midway between the first and second coefficient of thermal expansion.

2. The electronic device of claim 1, wherein the connector comprises a laminate material.

3. The electronic device of claim 2, wherein the laminate material comprises:
   a core;
   a dielectric material surrounding the core; and
   a solder mask.

4. The electronic device of claim 3, wherein the laminate further includes a plated through hole.

5. The electronic device of claim 3, further including a connection between at least one contact on the first surface and at least one contact on the second surface.

6. The electronic device of claim 5, further including a ground shield over the connection.

7. The electronic device of claim 3, wherein the core comprises a material selected from the group consisting of: copper-invar-copper, copper, stainless steel, nickel, iron and molybdenum.

8. The electronic device of claim 3, wherein the dielectric material comprises polyimide.

9. The electronic device of claim 1, wherein the contacts comprise ball grid array connections.

10. The electronic device of claim 1, wherein the first substrate comprises a chip package.

11. The electronic device of claim 1, wherein the second substrate comprises a printed circuit board.

12. The electronic device of claim 1, further comprising a stiffener frame attached to the connector.

13. The electronic device of claim 12, wherein the stiffener frame is adhesively attached to the connector.

14. The electronic device of claim 12, wherein the stiffener frame surrounds a perimeter of the connector.

15. The electronic device or claim 12, wherein the stiffener frame is removably attached to the connector.

16. The electronic device or claim 12, wherein the stiffener frame is attached to a surface of the connector.

17. The electronic device of claim 12, wherein the stiffener frame comprises a material selected from the group consisting of: plastic, metal and ceramic.

18. The electronic device of claim 12, wherein the stiffener frame comprises a heat sink.

19. A connector system, comprising:
a first substrate having a first coefficient of thermal expansion;
a second substrate having a second coefficient of thermal expansion;
a flexible connector having a core surrounded by a compliant material;
at least three contacts on a first surface of the flexible connector; and
at least three contacts on a second surface of the flexible connector, wherein the at least three contents on the first surface of the flexible connector are alternatingly off-set from the at least three contacts on the second surface of the flexible connector, wherein the flexible connector has a coefficient of thermal expansion between the first and second coefficient of thermal expansion, wherein the contacts on the first surface of the connector are attached to the first substance, and wherein the contacts on the second surface of the connector are attached to the second substrate.

20. The connector system of claim 19, wherein the flexible substrate comprises a laminate material.

21. The connector system of claim 19, wherein the flexible connector further comprises:
a solder mask over the compliant material.

22. The connector system of claim 19, wherein the flexible connector further includes a plated through hole.

23. The connector system of claim 19, wherein the further including a connection between at least one contact on the first surface and at least one contact on the second surface.

24. The connector system of claim 19, further including a ground shield over the connection.

25. The connector system of claim 19, wherein the core comprises a material selected from the group consisting of copper-invar-copper, copper, stainless steel, nickel, iron and molybdenum.

26. The connector system of claim 19, wherein the contacts comprise ball grid array connections.

27. The connector system of claim 19, further including a stiffener frame attached to the flexible connector.

28. The connector system of claim 27, wherein the stiffener frame is removably attached to the flexible connector.

29. The connector system of claim 19, wherein the at least three contacts on the first surface of the flexible connector are located at a far distance to a neutral point (DNP) on the first surface of the flexible connector and the at least three contacts on the second surface of the flexible connector are located at a far distance to a neutral point (DNP) on the second surface of the flexible connector.

30. The connector system of claim 19, wherein the compliant material comprises a dielectic material.

31. The connector system of claim 30, wherein the dielectric material comprises polyimide.

32. A method of forming an electronic device, comprising:
providing a first substrate having a first coefficient of thermal expansion;
providing a second substrate having a second coefficient to thermal expansion;
providing a flexible connector having a core surrounded by a compliant material, and a plurality of alternating contacts on a first surface and a second surface of the flexible connector, wherein at least three contacts in succession on the first surface alternate with at least three contacts in succession on the second surface, wherein the flexible connector has a coefficient of thermal expansion between the first and second coefficient of thermal expansion; and
attached the flexible connector between a first substrate and a second substrate via the contacts.

33. The method of claim 32, wherein the flexible connector comprises a laminate material.

34. The method of claim 32, wherein the contacts comprises the ball grid array connections.

35. The method of claim 32, wherein select contacts on the first surface of the flexible connector are off-set from the select contacts on the second surface of the flexible connector.

36. The method of claim 32, wherein the first substrate comprises a chip package.

37. The method of claim 32, wherein the second substrate comprises a printed circuit board.

38. A method of forming an electronic device, comprising:
providing a first substrate having a first coefficient of thermal expansion;
providing a second substrate having a second coefficient of thermal expansion;
providing a flexible connector having a coefficient of thermal expansion between the first and second coefficient of thermal expansion, and having at least three alternating contacts on a first surface and at least three alternating contacts on a second surface of the connector; and
attaching the contacts on the first surface of the connector to the first substrate and the contacts on the second surface of the connector to the second substrate.

39. The method of claim 38, wherein tho first substrate comprises a chip package.

40. The method of claim 38, wherein the second substrate comprises a printed circuit board.

41. The method of claim 38, wherein the flexible connector comprises a laminate material.

42. The method of claim 38, wherein the contacts comprise ball grid array connections.

43. The method of claim 36, wherein the further comprising:
providing a stiffener frame surrounding a perimeter edge of the flexible connector; and
attaching contacts.

* * * * *